United States Patent
Lee et al.

(10) Patent No.: US 10,447,206 B2
(45) Date of Patent: Oct. 15, 2019

(54) RADIO FREQUENCY (RF) RECEIVER CIRCUIT

(71) Applicant: NXP USA, INC., Austin, TX (US)

(72) Inventors: Jaeyoung Lee, Chandler, AZ (US); Nader Rohani, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/719,961

(22) Filed: Sep. 29, 2017

(65) Prior Publication Data
US 2019/0103839 A1  Apr. 4, 2019

(51) Int. Cl.
*H03F 3/45* (2006.01)
*H03F 1/02* (2006.01)
(Continued)

(52) U.S. Cl.
CPC ............ *H03F 1/0205* (2013.01); *H03F 1/26* (2013.01); *H03F 3/193* (2013.01); *H03F 3/195* (2013.01); *H03F 3/45179* (2013.01); *H03F 2200/294* (2013.01); *H03F 2200/333* (2013.01); *H03F 2200/75* (2013.01); *H03F 2203/45101* (2013.01); *H03F 2203/45296* (2013.01); *H03F 2203/45306* (2013.01); *H03F 2203/45316* (2013.01); *H03F 2203/45394* (2013.01);
(Continued)

(58) Field of Classification Search
CPC .......... H03F 1/0205; H03F 3/193; H03F 3/45; H03F 3/45179; H03F 3/45183; H03F 3/45188; H03F 3/45192; H03F 2200/177; H03F 1/22; H03F 1/223; H03F 2200/294; H03F 2200/372

USPC ................................................. 330/253, 261
See application file for complete search history.

(56) References Cited

U.S. PATENT DOCUMENTS 7,081,796 B2 *  7/2006  Krone ...................... H03F 1/26
                                                    330/129
7,224,225 B2 *  5/2007  Chang ..................... H03F 3/193
                                                    330/253

(Continued)

FOREIGN PATENT DOCUMENTS

EP     1833162 A1    9/2007
EP     2037573 A1    3/2009

OTHER PUBLICATIONS

Guermandi, D., "A 79GHz Binary Phase-Modulated Continuous-Wave Radar Transceiver with TX-to-RX Spillover Cancellation in 28nm CMOS", IEEE International Solid-State Circuits Conference, Session 19, Advanced Wireless Techniques—19/7, 2015.

(Continued)

*Primary Examiner* — Khanh V Nguyen (57) ABSTRACT

An integrated circuit includes a first high-pass filter having an input coupled to receive a first signal and an output coupled to a first input of a first differential pair of transistors. A second high-pass filter includes an input coupled to receive a second signal and an output coupled to a second input of the first differential pair of transistors. The second signal may be a complementary signal of the first signal. A second differential pair of transistors includes control electrodes coupled to a first voltage supply terminal. A boost circuit is coupled between the second differential pair of transistors and the first voltage supply terminal. A low-pass filter is coupled between the first differential pair of transistors and the second differential pair of transistors.

20 Claims, 5 Drawing Sheets

(51) Int. Cl.
*H03F 3/193* (2006.01)
*H03F 1/26* (2006.01)
*H03F 3/195* (2006.01)

(52) U.S. Cl.
CPC .............. *H03F 2203/45638* (2013.01); *H03F 2203/45686* (2013.01)

(56) References Cited

U.S. PATENT DOCUMENTS

| | | | |
|---|---|---|---|
| 7,495,515 B1 | 2/2009 | Branch et al. | |
| 7,808,319 B2* | 10/2010 | Kim | H03D 7/1441 330/253 |
| 8,237,509 B2* | 8/2012 | Kim | H03F 1/223 330/124 R |
| 8,319,562 B2* | 11/2012 | Sun | H03F 1/301 330/253 |
| 8,665,028 B2* | 3/2014 | Kim | H03F 1/223 330/124 R |
| 8,704,597 B2* | 4/2014 | Yu | H03F 3/45188 330/253 |
| 2007/0176679 A1 | 8/2007 | Kluge | |
| 2012/0274403 A1 | 11/2012 | Kim et al. | |
| 2015/0123736 A1* | 5/2015 | Un | H03F 3/193 330/306 |

OTHER PUBLICATIONS

Houfaf, F., "A 65nm CMOS 1-to-10GHz Tunable Continuous-Time Low-pass Filter for High-Data-Rate Communications", IEEE International Solid-State Circuits Conference, Session 21, Analog Techniques / 21.3, 2012.

Jang., J., "A 79-GHz Adaptive-Gain and Low-Noise UWB Radar Receiver Front-End in 65-nm CMOS", IEEE Transactions on Microwave Theory and Techniques, vol. 64, No. 3, Mar. 2016.

Lee, J., "A Fully-Integrated 77-GHz FMCW Radar Transceiver in 65-nm CMOS Technology", IEEE Journal of Solid-State Circuits, vol. 45, No. 12, Dec. 2010.

Liu, H., "A Wideband Analog-Controlled Variable-Gain Amplifier With dB-Linear Characteristic for High-Frequency Applications", IEEE Transactions on Microwave Theory and Techniques, vol. 64, No. 2, Feb. 2016.

Ng, H., "A Fully-Integrated 77-GHz UWB Pseudo-Random Noise Radar Transceiver With a Programmable Sequence Generator in SiGe Technology", IEEE Transactions on Circuits and Systems—I: Regular Papers, vol. 61, No. 8, Aug. 2014.

Tan., K., "A 79GHz UWB Pulse-Compression Vehicular Radar in 90nm CMOS", IEEE 2012.

Trotta, S., "An RCP Packaged Transceiver Chipset for Automotive LRR and SRR Systems in SiGe BiCMOS Technology", IEEE Transactions on Microwave Theory and Techniques, vol. 60, No. 3, Mar. 2012.

Wang, Y., "Design of a Low Power, Inductorless Wideband Variable-Gain Amplifier for High-Speed Receiver Systems", IEEE Transactions on Circuits and Systems—I: Regular Papers, vol. 59, No. 4, Apr. 2012.

Wang, Y., "A Linear-in-dB Analog Baseband Circuit for Low Power 60GHz Receiver in Standard 65NM CMOS", IEEE Radio Frequency Integrated Circuits Symposium, 2013.

Li, Z., "Image Rejection Low Noise Amplifier for WLAN 802.11a Application", Microwave Conference Proceedings, APMC2005, IEEE 2005.

Liao, C., "A 5.7-GHz 0.18 μm CMOS Gain-Controlled Differential LNA With Current Reuse for WLAN Receiver", IEEE Microwave and Wireless Components Letters, vol. 13, No. 12, Dec. 2003.

\* cited by examiner

RADIO FREQUENCY (RF) RECEIVER CIRCUIT

BACKGROUND

Field

This disclosure relates generally to radio frequency (RF) circuitry, and more specifically, to RF receiver amplifier circuitry in an integrated circuit (IC).

Related Art

Many systems-on-a-chip (SoC) integrated circuit applications include analog, digital, and radio frequency (RF) circuits on the same integrated circuit (IC). Transistor switching of the digital circuits, for example, can cause power supplies to be very noisy. Such analog and RF circuits may be highly sensitive to power supply noise. As performance requirements advance, effects of noise on analog and RF circuits can be exacerbated. Meeting today's performance requirements presents many challenges.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The design of intermediate frequency (e.g., 76-81-GHz) automotive radar receivers with deep sub-micron CMOS technologies is challenging due to stringent requirements such as low noise figure (NF) and high input 1-dB power compression point ($IP_{1dB}$) concurrently. Ultra-wideband (UWB) automotive radar receivers have faced additional design challenges for wideband intermediate frequency (IF) low-pass filters (LPFs) and amplifiers to process the down-converted IF signals occupying up to 2 GHz, for example, generated by 4-GHz radio frequency (RF) input signals with a fixed 79-GHz local oscillator (LO).

Generally, there is provided, a low-noise (e.g., NF<10 dB) wideband intermediate frequency amplifier (IFAMP) circuit suitable for on-chip transceiver integrated circuits (ICs), such as ultra-wideband automotive radar transceivers, for example. The IFAMP includes low-pass filter circuitry embedded in the current paths between a first differential input pair of transistors configured in a common-source arrangement and a second differential pair of transistors configured in a cascode arrangement. A differential IF input signal is received at high-pass filters coupled at the inputs of the first differential pair. Shunt peaking inductors are coupled to the second differential pair of transistors to extend the bandwidth at high IF frequencies (e.g., >2 GHz).

Figure 1:
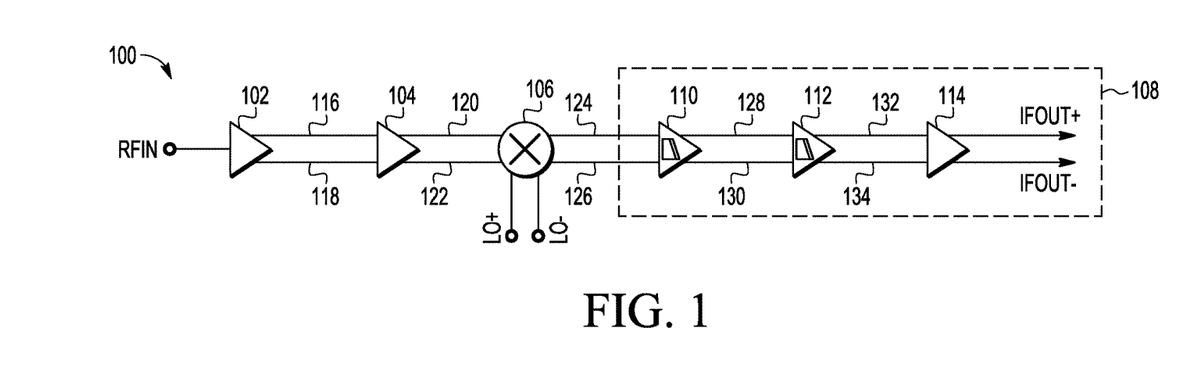
FIG. 1 illustrates, in schematic diagram form, an exemplary RF receiver circuit in accordance with an embodiment of the present disclosure.

FIG. 1 illustrates, in schematic diagram form, an exemplary RF receiver circuit 100 in accordance with an embodiment of the present disclosure. The RF receiver circuit 100 includes a two-stage low noise amplifier (LNA), passive mixer 106, and output amplifier section 108. The two-stage LNA includes a first stage LNA 102 coupled to receive a radio frequency (RF) signal at single-ended input labeled RFIN, and a differential output of LNA 102 is coupled at a differential input of second stage LNA 104 by way of signal lines 116 and 118. A differential output of LNA 104 is coupled at a first differential input of mixer 106 by way of signal lines 120 and 122, and a second differential input of mixer 106 is coupled to receive differential local oscillator (LO) signals at input terminals labeled LO+ and LO−.

Output amplifier section 108 includes a first intermediate frequency amplifier (IFAMP) 110, a second IFAMP 112, and an output buffer 114. A differential output of mixer 106 is coupled to provide intermediate frequency (IF) differential signals at a differential input of first IFAMP 110 by way of signal lines 124 and 126. A differential output of first IFAMP 110 is coupled at a differential input of second IFAMP 112 by way of signal lines 128 and 130, and a differential output of second IFAMP 112 is coupled at a differential input of output buffer 114 by way of signal lines 132 and 134. Output buffer 114 is coupled to provide differential output signals at output terminals labeled IFOUT+ and IFOUT−.

Figure 2:
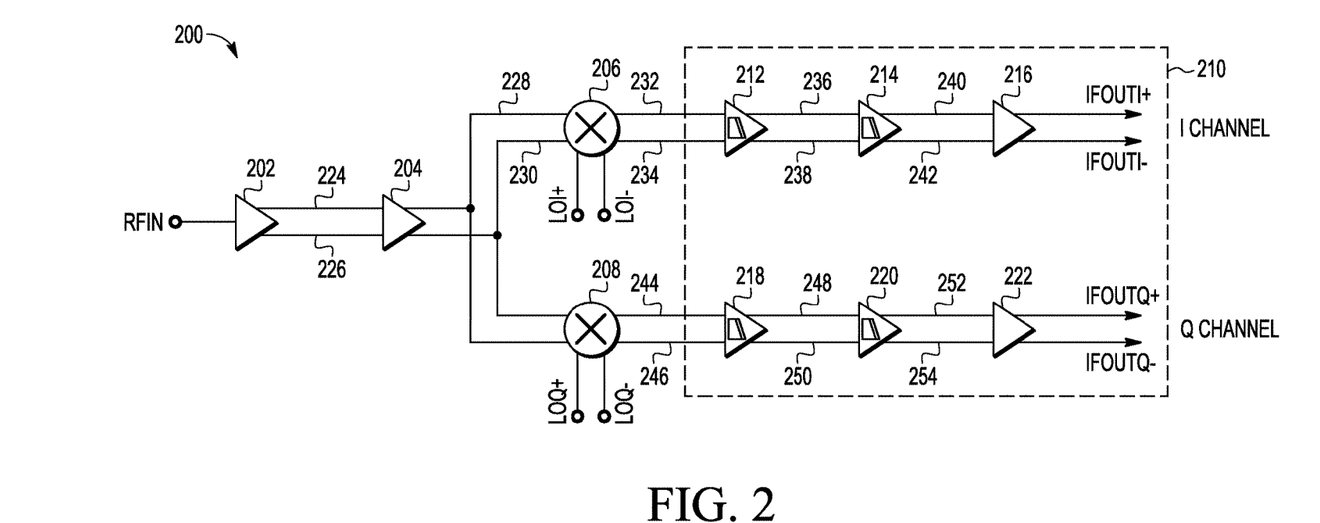
FIG. 2 illustrates, in schematic diagram form, an exemplary RF quadrature receiver circuit in accordance with an embodiment of the present disclosure.

FIG. 2 illustrates, in schematic diagram form, another exemplary RF receiver circuit 200 in accordance with an embodiment of the present disclosure. The RF receiver circuit 200 includes a two-stage LNA, passive mixers 206 and 208, and output amplifier section 210. The two-stage LNA includes a first LNA 202 coupled to receive a radio frequency (RF) signal at single-ended input labeled RFIN, and a differential output of LNA 202 is coupled at a differential input of second LNA 204 by way of signal lines 224 and 226. A differential output of LNA 204 is coupled at a first differential input of mixer 206 and a first differential input of mixer 208 by way of signal lines 228 and 230. A second differential input of mixer 206 is coupled to receive differential in-phase local oscillator (LOI) signals at input terminals labeled LOI+ and LOI−, and a second differential input of mixer 208 is coupled to receive differential quadrature local oscillator (LOQ) signals at input terminals labeled LOQ+ and LOQ−.

Output amplifier section 210 includes an in-phase portion and a quadrature portion. The in-phase portion of the output amplifier section 210 includes a first intermediate frequency amplifier (IFAMP) 212, a second IFAMP 214, and a first output buffer 216. A differential output of mixer 206 is coupled to provide in-phase IF differential signals at a differential input of first IFAMP 212 of by way of signal lines 232 and 234. A differential output of first IFAMP 212 is coupled at a differential input of second IFAMP 214 by way of signal lines 236 and 238, and a differential output of second IFAMP 214 is coupled at a differential input of first output buffer 216 by way of signal lines 240 and 242. First output buffer 216 is coupled to provide in-phase differential output signals at output terminals labeled IFOUTI+ and IFOUTI−.

The quadrature portion of the output amplifier section 210 includes a third IFAMP 218, a fourth IFAMP 220, and a second output buffer 222. A differential output of mixer 208 is coupled to provide quadrature IF differential signals at a differential input of third IFAMP 218 of by way of signal lines 244 and 246. A differential output of third IFAMP 218 is coupled at a differential input of fourth IFAMP 220 by way of signal lines 248 and 250, and a differential output of fourth IFAMP 220 is coupled at a differential input of second output buffer 222 by way of signal lines 252 and 254. Second output buffer 222 is coupled to provide quadrature differential output signals at output terminals labeled IFOUTQ+ and IFOUTQ−.

Figure 3:
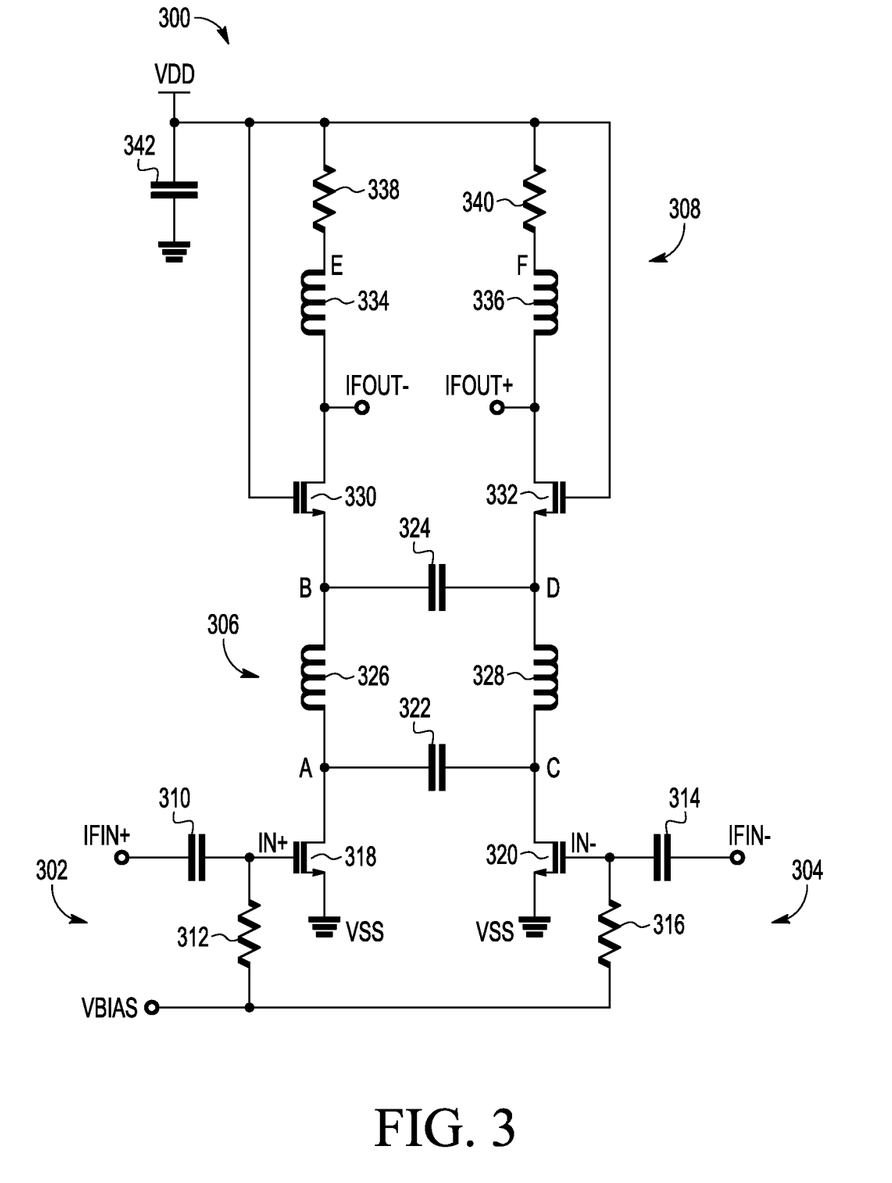
FIG. 3 illustrates, in schematic diagram form, an exemplary intermediate frequency amplifier circuit in accordance with an embodiment of the present disclosure.

FIG. 3 illustrates, in schematic diagram form, an exemplary intermediate frequency amplifier (IFAMP) circuit 300 in accordance with an embodiment of the present disclosure. IFAMP circuit 300 includes differential input terminals labeled IFIN+ and IFIN−, differential output terminals IFOUT+ and IFOUT−, common-source differential pair of N-channel transistors 318 and 320, cascode differential pair N-channel transistors 330 and 332, low-pass filter (LPF) circuitry 306, high-pass filter (HPF) circuitry 302 and 304, load resistors 338 and 340, and boost circuit 308. In this embodiment, a differential pair of signals (e.g., two complementary signals) is received at input terminals IFIN+ and IFIN− respectively. Differential output signals are provided at output terminals IFOUT+ and IFOUT−.

A first HPF circuit 302 is connected at first input terminal IFIN+. First HPF 302 includes capacitor 310 and resistor 312. A first terminal of capacitor 310 is connected to input terminal IFIN+, and a second terminal of capacitor 310 is connected to a first terminal of resistor 312 and a control electrode of transistor 318. A second terminal of resistor 312 is connected to a bias voltage supply terminal labeled VBIAS. In this embodiment, VBIAS voltage supply terminal is coupled to receive a positive supply voltage. In other embodiments, the VBIAS voltage supply terminal may be coupled to receive a different supply voltage. A second HPF circuit 304 is connected at second input IFIN− and includes capacitor 314 and resistor 316. A first terminal of capacitor 314 is connected to input terminal IFIN−, and a second terminal of capacitor 314 is connected to a first terminal of resistor 316 and a control electrode of transistor 320. A second terminal of resistor 316 is connected to the VBIAS voltage supply terminal. A first current electrode of transistor 318 is connected to a first voltage supply terminal labeled VSS, and a first current electrode of transistor 320 is connected to the VSS voltage supply terminal. In this embodiment, VSS voltage supply terminal may be characterized as a ground voltage supply terminal and coupled to receive a ground or 0-volt supply voltage.

LPF circuitry 306 includes capacitors 322 and 324, and inductors 326 and 328 connected between common-source transistors (318, 320) and cascode transistors (330, 332). A first terminal of capacitor 322 is connected to a first terminal of inductor 326 and a second current electrode of transistor 318 at node labeled A. A second terminal of inductor 326 is connected to a first terminal of capacitor 324 and a first current electrode of transistor 330 at node labeled B. A second terminal of capacitor 322 is connected to a first terminal of inductor 328 and a second current electrode of transistor 320 at node labeled C. A second terminal of inductor 328 is connected to a second terminal of capacitor 324 and a first current electrode of transistor 332 at node labeled D. In this embodiment, LPF circuitry 306 is characterized as a differential 3rd-order lumped-element low-pass filter.

Cascode transistors 330 and 332 are coupled between LPF circuitry 306 and differential output terminals IFOUT+ and IFOUT−. A control electrode of transistor 330 is connected to a second voltage supply terminal labeled VDD and a second current electrode of transistor 330 is connected to first output terminal labeled IFOUT−. In this embodiment, VDD voltage supply terminal is coupled to receive a positive supply voltage. In other embodiments, the VDD voltage supply terminal may be coupled to receive a different supply voltage. A control electrode of transistor 332 is connected to the VDD voltage supply terminal and a second current electrode of transistor 332 is connected to second output terminal labeled IFOUT+.

Load resistors 338 and 340 and boost circuit 308 are coupled in series between differential output terminals (IFOUT+, IFOUT−) and the VDD voltage supply terminal. The boost circuit 308 includes boost inductors 334 and 336. A first terminal of inductor 334 is connected to IFOUT− output terminal and a second terminal of inductor 334 is connected to a first terminal of resistor 338 at node labeled E. A first terminal of inductor 336 is connected to IFOUT+ output terminal and a second terminal of inductor 336 is connected to a first terminal of resistor 340 at node labeled F. Second terminals of resistors 338 and 340 are connected to the VDD voltage supply terminal. In this embodiment, values for load resistors 338 and 340 and boost inductors 334 and 336 are chosen to provide a 100-ohm differential load impedance over the operating bandwidth of IFAMP circuit 300. Other values for load resistors 338 and 340 and boost inductors 334 and 336 may be chosen to provide other differential load impedances. A capacitor 342 has a first terminal connected to the VDD voltage supply terminal and a second terminal connected to the VSS voltage supply terminal.

Figure 4:
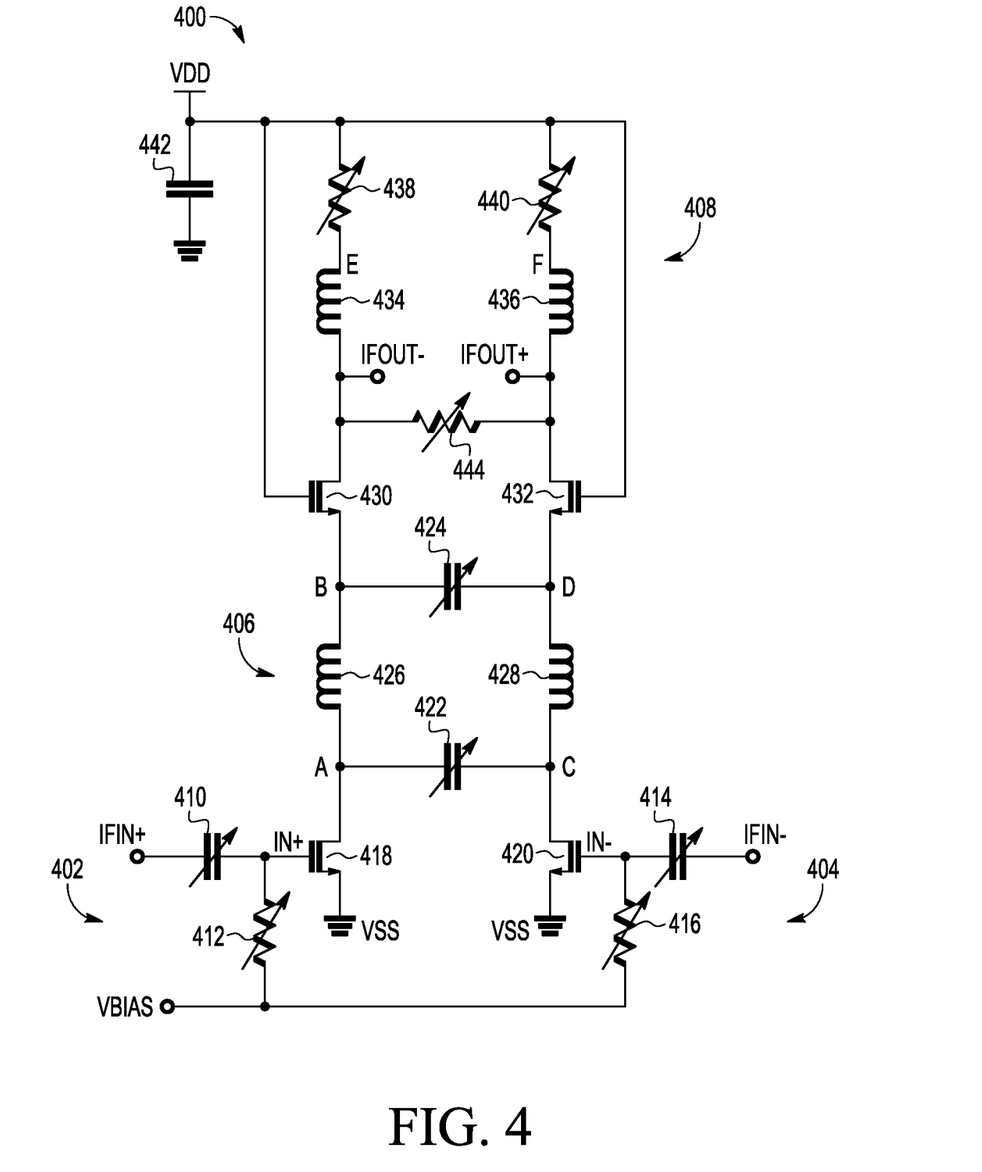
FIG. 4 illustrates, in schematic diagram form, another exemplary intermediate frequency amplifier circuit in accordance with an embodiment of the present disclosure.

FIG. 4 illustrates, in schematic diagram form, another exemplary intermediate frequency amplifier (IFAMP) circuit 400 in accordance with an embodiment of the present disclosure. IFAMP circuit 400 includes differential input terminals labeled IFIN+ and IFIN−, differential output terminals IFOUT+ and IFOUT−, common-source N-channel transistors 418 and 420, cascode N-channel transistors 430 and 432, low-pass filter (LPF) circuitry 406, high-pass filter (HPF) circuitry 402 and 404, load resistors 438 and 440, and boost circuit 408. In this embodiment, a differential pair of signals (e.g., two complementary signals) is received at input terminals IFIN+ and IFIN− respectively. Differential output signals are provided at output terminals IFOUT+ and IFOUT−.

A first HPF circuit 402 is connected at first input IFIN+. First HPF 402 includes variable capacitor 410 and variable resistor 412. A first terminal of variable capacitor 410 is connected to input terminal IFIN+, and a second terminal of variable capacitor 410 is connected to a first terminal of variable resistor 412 and a control electrode of transistor 418. A second terminal of variable resistor 412 is connected to a bias voltage supply terminal labeled VBIAS. In this embodiment, VBIAS voltage supply terminal is coupled to receive a positive supply voltage. In other embodiments, the VBIAS voltage supply terminal may be coupled to receive a different supply voltage. A second HPF circuit 404 is connected at second input IFIN− and includes variable capacitor 414 and variable resistor 416. A first terminal of variable capacitor 414 is connected to input terminal IFIN−, and a second terminal of variable capacitor 414 is connected to a first terminal of variable resistor 416 and a control electrode of transistor 420. A second terminal of variable resistor 416 is connected to the VBIAS voltage supply terminal. A first current electrode of transistor 418 is connected to a first voltage supply terminal labeled VSS, and a first current electrode of transistor 420 is connected to the VSS voltage supply terminal. In this embodiment, VSS voltage supply terminal may be characterized as a ground voltage supply terminal and may be coupled to receive a ground or 0-volt supply voltage.

LPF circuitry 406 includes variable capacitors 422 and 424, and inductors 426 and 428 connected between common-source transistors (418, 420) and cascode transistors (430, 432). A first terminal of variable capacitor 422 is connected to a first terminal of inductor 426 and a second current electrode of transistor 418 a t node labeled A. A second terminal of inductor 426 is connected to a first terminal of variable capacitor 424 and a first current electrode of transistor 430 at node labeled B. A second terminal of variable capacitor 422 is connected to a first terminal of inductor 428 and a second current electrode of transistor 420 at node labeled C. A second terminal of inductor 428 is connected to a second terminal of variable capacitor 424 and a first current electrode of transistor 432 at node labeled D. In this embodiment, LPF circuitry 406 is characterized as a differential 3rd-order lumped-element low-pass filter.

Cascode transistors 430 and 432 are coupled between LPF circuitry 406 and differential output terminals IFOUT+ and IFOUT−. A control electrode of transistor 430 is connected to a second voltage supply terminal labeled VDD and a second current electrode of transistor 430 is connected to first output terminal labeled IFOUT−. In this embodiment, VDD voltage supply terminal is coupled to receive a positive supply voltage. In other embodiments, the VDD voltage supply terminal may be coupled to receive a different supply voltage. A control electrode of transistor 432 is connected to the VDD voltage supply terminal and a second current electrode of transistor 432 is connected to second output terminal labeled IFOUT+.

Variable load resistors 438 and 440 and boost circuit 408 are coupled in series between differential output terminals (IFOUT+, IFOUT−) and the VDD voltage supply terminal. The boost circuit 408 includes inductors 434 and 436. A first terminal of inductor 434 is connected to IFOUT− output terminal and a second terminal of inductor 434 is connected to a first terminal of variable resistor 438 at node labeled E. A first terminal of inductor 436 is connected to IFOUT+ output terminal and a second terminal of inductor 436 is connected to a first terminal of variable resistor 440 at node labeled F. Second terminals of variable resistors 438 and 440 are connected to the VDD voltage supply terminal. In this embodiment, values for load resistors 438 and 440 and boost inductors 434 and 436 are chosen to provide a 100-ohm differential load impedance over the operating bandwidth of IFAMP circuit 400. Other values for load resistors 438 and 440 and boost inductors 434 and 436 may be chosen to provide other differential load impedances.

A first terminal of variable output resistor 444 is connected to IFOUT− output terminal and a second terminal of variable output resistor 444 is connected to IFOUT+ output terminal. Variable output resistor 444 provides gain control for IFAMP circuit 400. A capacitor 442 has a first terminal connected to the VDD voltage supply terminal and a second terminal connected to the VSS voltage supply terminal.

Figure 5:
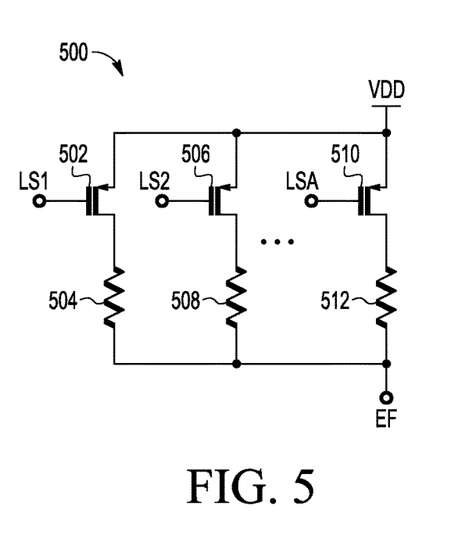
FIG. 5 illustrates, in schematic diagram form, an exemplary variable load resistor circuit in accordance with an embodiment of the present disclosure.

FIG. 5 illustrates, in schematic diagram form, an exemplary variable load resistor circuit 500 in accordance with an embodiment of the present disclosure. Variable load resistor 500 is an example circuit implementation for each of variable resistors 438 and 440 in FIG. 4. For example, variable load resistor 500 can be interchanged with variable resistor 438 where VDD and EF terminals of variable load resistor 500 correspond to VDD and E terminals of variable resistor 438. Variable load resistor circuit 500 includes a plurality of resistor segments (504, 508, 512) connected in series with P-channel transistors (502, 506, 510). Variable load resistor 500 may have any number of resistor segments. For example, 1 through A number of transistor-resistor segment pairs are depicted in FIG. 5, where A in an integer number.

A first transistor-resistor segment pair includes series connected transistor 502 and resistor segment 504. A first current electrode of transistor 502 is connected to terminal labeled VDD, a second current electrode of transistor 502 is connected to a first terminal of resistor segment 504, and a second terminal of resistor segment 504 is connected to a terminal labeled EF. A second transistor-resistor segment pair includes series connected transistor 506 and resistor segment 508. A first current electrode of transistor 506 is connected to the VDD terminal, a second current electrode of transistor 506 is connected to a first terminal of resistor segment 508, and a second terminal of resistor segment 508 is connected to the EF terminal. An Ath transistor-resistor segment pair includes series connected transistor 510 and resistor segment 512. A first current electrode of transistor 510 is connected to the VDD terminal, a second current electrode of transistor 510 is connected to a first terminal of resistor segment 512, and a second terminal of resistor segment 512 is connected to the EF terminal.

A control electrode of transistor 502 is coupled to receive a first control signal labeled LS1. A control electrode of transistor 506 is coupled to receive a second control signal labeled LS2, and so on. A control electrode of transistor 510 is coupled to receive an Ath control signal labeled LSA. Control signals LS1 through LSA are used to selectively include or exclude resistor segments 504-512 when choosing a resistance value of variable load resistor 500. Control signals LS1 through LSA may be provided by control registers or other control circuitry (not shown). In this embodiment, transistor-resistor segment pairs 1 through A are configured in a parallel arrangement with one another.

Figure 6:
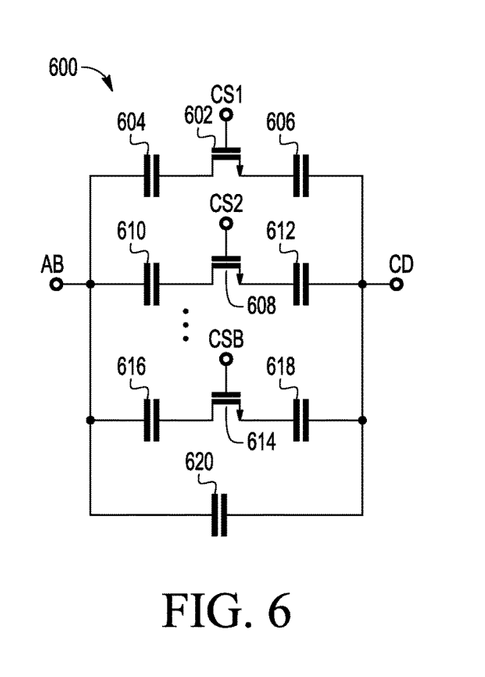
FIG. 6 illustrates, in schematic diagram form, an exemplary variable capacitor circuit in accordance with an embodiment of the present disclosure.

FIG. 6 illustrates, in schematic diagram form, an exemplary variable capacitor circuit 600 in accordance with an embodiment of the present disclosure. Variable capacitor 600 is an example circuit implementation for each of variable capacitors 422 and 424 in FIG. 4. For example, variable capacitor 600 can be interchanged with variable capacitor 422 where AB and CD terminals of variable capacitor 600 correspond to A and C terminals of variable capacitor 422. Variable capacitor 600 includes a plurality of capacitor segments (604-606, 610-612, 616-618) connected in series with N-channel transistors (602, 608, 614), and capacitor 620. Variable capacitor 600 may have any number of capacitor segments. For example, 1 through B number of transistor-capacitor segment sets are depicted in FIG. 6, where B in an integer number.

A first transistor-capacitor segment set includes series connected transistor 602 and capacitor segments 604 and 606. A first terminal of capacitor segment 604 is connected to terminal labeled AB and a second terminal of capacitor segment 604 is connected to a first current electrode of transistor 602. A second current electrode of transistor 602 is connected to first terminal of capacitor segment 606 and a second terminal of capacitor segment 606 is connected to terminal labeled CD. A second transistor-capacitor segment set includes series connected transistor 608 and capacitor segments 610 and 612. A first terminal of capacitor segment 610 is connected to AB terminal and a second terminal of capacitor segment 610 is connected to a first current electrode of transistor 608. A second current electrode of transistor 608 is connected to first terminal of capacitor segment 612 and a second terminal of capacitor segment 612 is connected to CD terminal. A Bth transistor-capacitor segment set includes series connected transistor 614 and capacitor segments 616 and 618. A first terminal of capacitor segment 616 is connected to AB terminal and a second terminal of capacitor segment 616 is connected to a first current electrode of transistor 614. A second current electrode of transistor 614 is connected to first terminal of capacitor segment 612 and a second terminal of capacitor segment 612 is connected to CD terminal. Fixed capacitor 602 is connected between AB terminal and CD terminal. A first terminal of capacitor 602 is connected to AB terminal and a second terminal of capacitor 602 is connected to CD terminal.

A control electrode of transistor 602 is coupled to receive a first control signal labeled CS1. A control electrode of transistor 608 is coupled to receive a second control signal labeled CS2, and so on. A control electrode of transistor 614 is coupled to receive a Bth control signal labeled CSB. Control signals CS1 through CSB are used to selectively include or exclude capacitor segments 604-606, 610-612, 616-618 when choosing a capacitance value of variable capacitor 600. Control signals CS1 through CSB may be provided by control registers or other control circuitry (not shown). In this embodiment, transistor-capacitor segment sets 1 through B are configured in a parallel arrangement with one another and capacitor 620.

Figure 7:
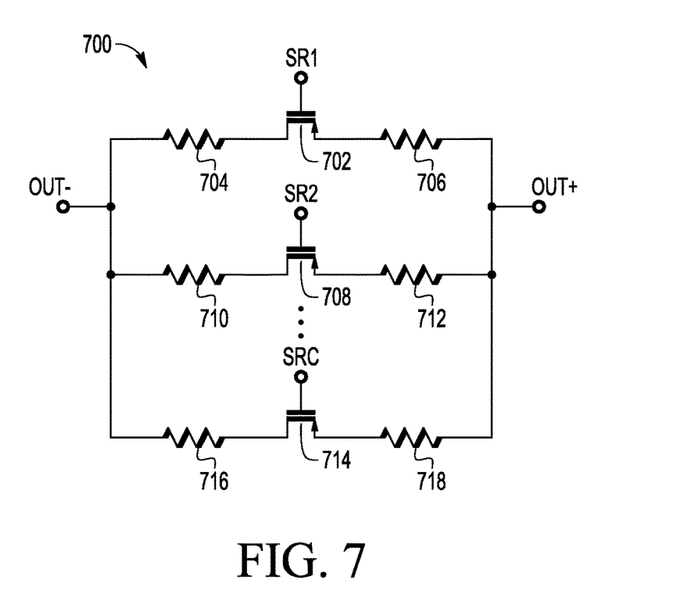
FIG. 7 illustrates, in schematic diagram form, an exemplary variable resistor circuit in accordance with an embodiment of the present disclosure.

FIG. 7 illustrates, in schematic diagram form, an exemplary variable gain resistor circuit 700 in accordance with an embodiment of the present disclosure. Variable resistor 700 is an example circuit implementation for variable output resistor 444 in FIG. 4. For example, variable resistor 700 can be interchanged with variable resistor 444 where OUT− and OUT+ terminals of variable resistor 700 correspond to IFOUT− and IFOUT+ terminals of variable resistor 444. Variable resistor 700 includes a plurality of resistor segments (704-706, 710-712, 716-718) connected in series with P-channel transistors (702, 708, 714). Variable resistor 700 may have any number of resistor segments. For example, 1 through C number of transistor-resistor segment sets are depicted in FIG. 7, where C in an integer number. In this embodiment, transistor-resistor segment sets 1 through C are configured in a parallel arrangement with one another.

A first transistor-resistor segment set includes series connected transistor 702 and resistor segments 704 and 706. A first terminal of resistor segment 704 is connected to terminal labeled OUT− and a second terminal of resistor segment 704 is connected to a first current electrode of transistor 702. A second current electrode of transistor 702 is connected to first terminal of resistor segment 706 and a second terminal of resistor segment 706 is connected to terminal labeled OUT+. A second transistor-resistor segment set includes series connected transistor 708 and resistor segments 710 and 712. A first terminal of resistor segment 710 is connected to OUT− terminal and a second terminal of resistor segment 710 is connected to a first current electrode of transistor 708. A second current electrode of transistor 708 is connected to first terminal of resistor segment 712 and a second terminal of resistor segment 712 is connected to OUT+ terminal. A Cth transistor-resistor segment set includes series connected transistor 714 and resistor segments 716 and 718. A first terminal of resistor segment 716 is connected to OUT− terminal and a second terminal of resistor segment 716 is connected to a first current electrode of transistor 714. A second current electrode of transistor 714 is connected to first terminal of resistor segment 712 and a second terminal of resistor segment 712 is connected to OUT+ terminal.

A control electrode of transistor 702 is coupled to receive a first control signal labeled SR1. A control electrode of transistor 708 is coupled to receive a second control signal labeled SR2, and so on. A control electrode of transistor 714 is coupled to receive a Cth control signal labeled SRC. Control signals SR1 through SRC are used to selectively include or exclude resistor segments 704-706, 710-712, 716-718 when choosing a resistance value of variable resistor 700. Control signals SR1 through SRC may be provided by control registers or other control circuitry (not shown).

Figure 8:
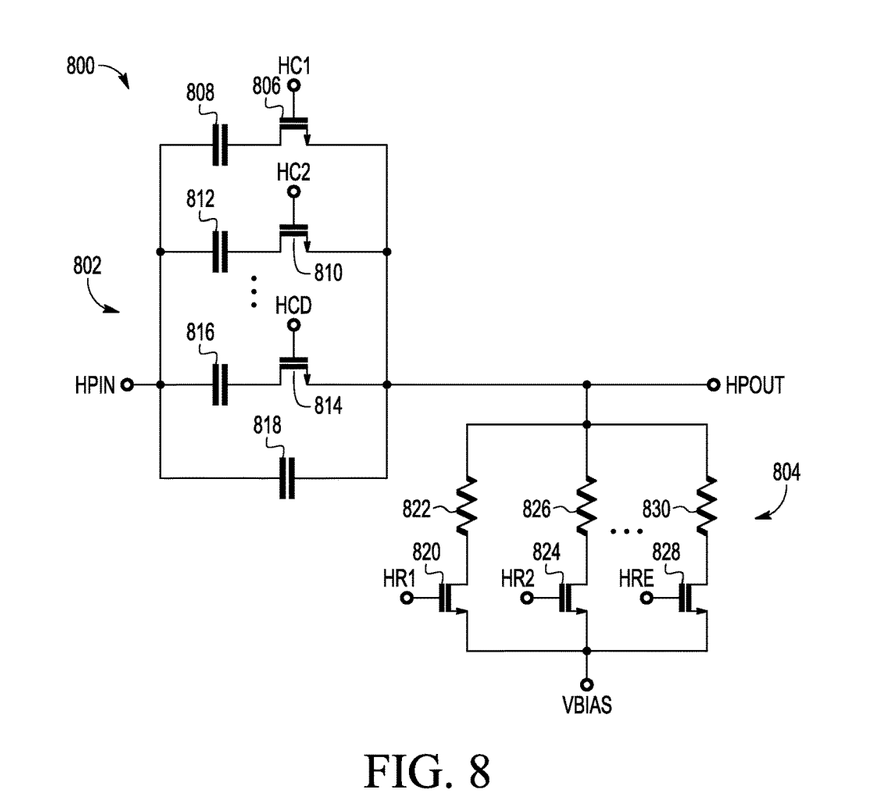
FIG. 8 illustrates, in schematic diagram form, exemplary variable RC circuit in accordance with an embodiment of the present disclosure.

FIG. 8 illustrates, in schematic diagram form, exemplary variable RC circuit 800 in accordance with an embodiment of the present disclosure. Variable RC circuit 800 is an example circuit implementation for each of high-pass filters 402 and 404 depicted in FIG. 4. Variable RC circuit 800 includes variable capacitor circuitry 802 and variable resistor circuitry 804. For example, variable capacitor circuitry 802 and variable resistor circuitry 804 can be interchanged with variable capacitor 410 and variable resistor 412 of high-pass filter 402 where HPIN, VBIAS, and HPOUT terminals of variable RC circuit 800 correspond to IFIN+, VBIAS, and IN+ terminals of high-pass filter 402.

Variable capacitor circuitry 802 includes a plurality of capacitor segments (808, 812, 816) connected in series with N-channel transistors (806, 810, 814), and capacitor 818. Variable capacitor circuitry 802 may have any number of capacitor segments. For example, 1 through D number of transistor-capacitor segment pairs are depicted, where D in an integer number.

A first transistor-capacitor segment pair includes series connected transistor 806 and capacitor segment 808. A first terminal of capacitor segment 808 is connected to terminal labeled HPIN and a second terminal of capacitor segment 808 is connected to a first current electrode of transistor 806. A second current electrode of transistor 806 is connected to terminal labeled HPOUT. A second transistor-capacitor segment pair includes series connected transistor 810 and capacitor segment 812. A first terminal of capacitor segment 812 is connected to HPIN terminal and a second terminal of capacitor segment 812 is connected to a first current electrode of transistor 810. A second current electrode of transistor 810 is connected to HPOUT terminal. A Dth transistor-capacitor segment pair includes series connected transistor 814 and capacitor segment 816. A first terminal of capacitor segment 816 is connected to HPIN terminal and a second terminal of capacitor segment 816 is connected to a first current electrode of transistor 814. A second current electrode of transistor 814 is connected to HPOUT terminal. Fixed capacitor 818 is connected between HPIN terminal and HPOUT terminal. A first terminal of capacitor 818 is connected to HPIN terminal and a second terminal of capacitor 818 is connected to HPOUT terminal.

A control electrode of transistor 806 is coupled to receive a first control signal labeled HC1. A control electrode of transistor 810 is coupled to receive a second control signal labeled HC2, and so on. A control electrode of transistor 814 is coupled to receive a Dth control signal labeled HCD. Control signals HC1 through HCD are used to selectively include or exclude capacitor segments 808, 812, 816 when choosing a capacitance value of variable capacitor circuitry 802. Control signals HC1 through HCD may be provided by control registers or other control circuitry (not shown). In this embodiment, transistor-capacitor segment pairs 1 through D are configured in a parallel arrangement with one another and capacitor 818.

Variable resistor circuitry 804 includes a plurality of resistor segments (822, 826, 830) connected in series with N-channel transistors (820, 824, 828). Variable resistor circuitry 804 may have any number of resistor segments. For example, 1 through E number of transistor-resistor segment pairs are depicted, where E in an integer number.

A first transistor-resistor segment pair includes series connected transistor 820 and resistor segment 822. A first current electrode of transistor 820 is connected to terminal labeled VBIAS, a second current electrode of transistor 820 is connected to a first terminal of resistor segment 822, and a second terminal of resistor segment 822 is connected to a terminal labeled HPOUT. A second transistor-resistor segment pair includes series connected transistor 824 and resistor segment 826. A first current electrode of transistor 824 is connected to the VBIAS terminal, a second current electrode of transistor 824 is connected to a first terminal of resistor segment 826, and a second terminal of resistor segment 826 is connected to the HPOUT terminal. An Eth transistor-resistor segment pair includes series connected transistor 828 and resistor segment 830. A first current electrode of transistor 828 is connected to the VBIAS terminal, a second current electrode of transistor 828 is connected to a first terminal of resistor segment 830, and a second terminal of resistor segment 830 is connected to the HPOUT terminal.

A control electrode of transistor 820 is coupled to receive a first control signal labeled HR1. A control electrode of transistor 824 is coupled to receive a second control signal labeled HR2, and so on. A control electrode of transistor 828 is coupled to receive an Eth control signal labeled HRE. Control signals HR1 through HRE are used to selectively include or exclude resistor segments 822, 826, 830 when choosing a resistance value of variable resistor circuitry 804. Control signals HR1 through HRE may be provided by control registers or other control circuitry (not shown). In this embodiment, transistor-resistor segment pairs 1 through E are configured in a parallel arrangement with one another.

In this embodiment, control signals HC1 through HCD and HR1 through HRE are used to select desired capacitance and resistance values for variable capacitor circuitry 802 and variable resistor circuitry 804, respectively, such that predetermined frequencies can be cut off.

Figure 9:
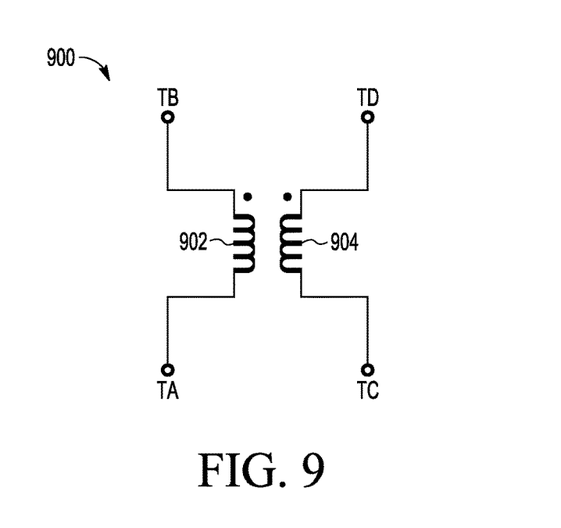
FIG. 9 illustrates, in schematic diagram form, exemplary transformer arrangement of inductors circuit in accordance with an embodiment of the present disclosure.

FIG. 9 illustrates, in schematic diagram form, an exemplary transformer circuit 900 in accordance with an embodiment of the present disclosure. The transformer 900 is an example circuit implementation for inductor pairs 326-328 and 334-336 in FIG. 3, and inductor pairs 426-428 and 434-436 in FIG. 4. Any of inductor pairs 326-328 and 334-336 in FIGS. 3 and 426-428 and 434-436 in FIG. 4 may be configured as transformer 900, for example. For example, transformer 900 can be interchanged with inductor pair 326-328 where TA, TB, TC, and TD terminals of transformer 900 correspond to A, B, C, and D terminals of inductor pair 326-328.

Transformer 900 includes a first inductive winding 902 coupled to a second inductive winding 904. A first terminal of first inductive winding 902 is connected to terminal labeled TA, and a second terminal of first inductive winding 902 is connected to terminal labeled TB. A first terminal of second inductive winding 904 is connected to terminal labeled TC, and a second terminal of second inductive winding 904 is connected to terminal labeled TD.

Generally, there is provided, an integrated circuit including a first input terminal coupled to receive a first signal; a second input terminal coupled to receive a second signal, the second signal a complementary signal of the first signal; a first high-pass filter coupled between the first input terminal and a control electrode of a first transistor; a second high-pass filter coupled between the second input terminal and a control electrode of a second transistor; a third transistor having a control electrode coupled to a first voltage supply terminal and a first current electrode coupled to a first output terminal; a fourth transistor having a control electrode coupled to the first voltage supply terminal and a first current electrode coupled to a second output terminal; and a low-pass filter coupled between first current electrodes of the first and second transistors and second current electrodes of the third and fourth transistors. The integrated circuit may further include a boost circuit coupled between first voltage supply terminal and first and second output terminals. The boost circuit may include a first boost inductor having a first terminal coupled to the first output terminal; and a second boost inductor having a first terminal coupled to the second output terminal. The first and second boost inductors may be configured as a first transformer. The integrated circuit may further include a first load resistor having a first terminal coupled to a second terminal of the first boost inductor, and a second terminal coupled to the first voltage supply terminal; and a second load resistor having a first terminal coupled to a second terminal of the second boost inductor, and a second terminal coupled to the first voltage supply terminal. The low-pass filter may include a first capacitor having a first terminal coupled to the first current electrode of the first transistor and a second terminal coupled to the first current electrode of the second transistor; a second capacitor having a first terminal coupled to the second current electrode of the third transistor and a second terminal coupled to the second current electrode of the fourth transistor; a first inductor having a first terminal coupled to the first terminal of the first capacitor and a second terminal coupled to the first terminal of the second capacitor; and a second inductor having a first terminal coupled to the second terminal of the first capacitor and a second terminal coupled to the second terminal of the second capacitor. Each of the first capacitor and the second capacitor may be characterized as a variable capacitor. The first and second inductors may be configured as a second transformer. The integrated circuit may further include an output resistor coupled between the first output terminal and the second output terminal.

In another embodiment, there is provided, an integrated circuit including a first high-pass filter having an input coupled to receive a first signal and an output coupled to a first input of a first differential pair of transistors; a second high-pass filter having an input coupled to receive a second signal and an output coupled to a second input of the first differential pair of transistors, the second signal a complementary signal of the first signal; a second differential pair of transistors having control electrodes coupled to a first voltage supply terminal; a boost circuit coupled between the second differential pair of transistors and the first voltage supply terminal; and a low-pass filter coupled between the first differential pair of transistors and the second differential pair of transistors. The first differential pair of transistors may be configured in a common-source arrangement. The first high-pass filter may include a first capacitor having a first terminal coupled to the first input of the first differential pair and to a first terminal of a first resistor, a second terminal of the first resistor coupled to a second voltage supply terminal, and wherein the second high-pass filter may include a second capacitor having a first terminal coupled to the second input of the first differential pair and to a first terminal of a second resistor, a second terminal of the second resistor coupled to the second voltage supply terminal. The second voltage supply terminal may be coupled to provide a positive bias voltage. The integrated circuit may further include a load resistor pair coupled between the boost circuit and the first voltage supply terminal. The integrated circuit may further include an output resistor coupled between first current electrodes of the second differential pair of transistors. The low-pass filter may include a first capacitor having a first terminal and a second terminal coupled to current electrodes of the first differential pair of transistors; a second capacitor having a first terminal and a second terminal coupled to current electrodes of the second differential pair of transistors; a first inductor having a first terminal coupled to the first terminal of the first capacitor and a second terminal coupled to the first terminal of the second capacitor; and a second inductor having a first terminal coupled to the second terminal of the first capacitor and a second terminal coupled to the second terminal of the second capacitor. Each of the first capacitor and the second capacitor may be characterized as a variable capacitor.

In yet another embodiment, there is provided, an integrated circuit including a first amplifier circuit including a first high-pass filter having an input coupled to receive a first signal and an output coupled to a first input of a first differential pair of transistors; a second high-pass filter having an input coupled to receive a second signal and an output coupled to a second input of the first differential pair of transistors, the second signal a complementary signal of the first signal; a second differential pair of transistors having control electrodes coupled to a first voltage supply terminal; a boost circuit coupled between the second differential pair of transistors and the first voltage supply terminal; and a low-pass filter coupled between the first differential pair of transistors and the second differential pair of transistors; a low noise amplifier (LNA) circuit coupled to receive a radio frequency signal; and a first mixer circuit having a first differential input coupled to a differential output of the LNA circuit, and a first differential output coupled to inputs of the first and second high-pass filters of the first amplifier circuit. The first high-pass filter of the first amplifier circuit may include a first capacitor having a first terminal coupled to the first input of the first differential pair and to a first terminal of a first resistor, a second terminal of the first resistor coupled to a second voltage supply terminal, and wherein the second high-pass filter of the second amplifier circuit may include a second capacitor having a first terminal coupled to the second input of the first differential pair and to a first terminal of a second resistor, a second terminal of the second resistor coupled to the second voltage supply terminal. The low-pass filter of the first amplifier circuit may include a first capacitor having a first terminal and a second terminal coupled to current electrodes of the first differential pair of transistors; a second capacitor having a first terminal and a second terminal coupled to current electrodes of the second differential pair of transistors; a first inductor having a first terminal coupled to the first terminal of the first capacitor and a second terminal coupled to the first terminal of the second capacitor; and a second inductor having a first terminal coupled to the second terminal of the first capacitor and a second terminal coupled to the second terminal of the second capacitor.

By now it should be appreciated that there has been provided, a low-noise (e.g., NF<10 dB) wideband intermediate frequency amplifier (IFAMP) circuit suitable for on-chip transceiver integrated circuits (ICs), such as ultra-wideband automotive radar transceivers, for example. The IFAMP includes low-pass filter circuitry embedded in the current paths between a first differential input pair of transistors configured in a common-source arrangement and a second differential pair of transistors configured in a cascode arrangement. A differential IF input signal is received at high-pass filters coupled at the inputs of the first differential pair. Shunt peaking inductors are coupled to the second differential pair of transistors to extend the bandwidth at high IF frequencies (e.g., >2 GHz).

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
    a first input terminal coupled to receive a first signal;
    a second input terminal coupled to receive a second signal, the second signal a complementary signal of the first signal;
    a first high-pass filter coupled between the first input terminal and a control electrode of a first transistor;
    a second high-pass filter coupled between the second input terminal and a control electrode of a second transistor;
    a third transistor having a control electrode coupled to a first voltage supply terminal and a first current electrode coupled to a first output terminal;
    a fourth transistor having a control electrode coupled to the first voltage supply terminal and a first current electrode coupled to a second output terminal;
    a first boost inductor having a first terminal coupled to the first output terminal;
    a second boost inductor having a first terminal coupled to the second output terminal;
    a first load resistor having a first terminal coupled to a second terminal of the first boost inductor, and a second terminal coupled to the first voltage supply terminal;
    a second load resistor having a first terminal coupled to a second terminal of the second boost inductor, and a second terminal coupled to the first voltage supply terminal;
    an output resistor coupled between the first output terminal and the second output terminal; and
    a low-pass filter coupled between first current electrodes of the first and second transistors and second current electrodes of the third and fourth transistors.

2. The integrated circuit of claim 1, wherein the first and second boost inductors are configured as a first transformer.

3. The integrated circuit of claim 1, wherein the low-pass filter comprises:
    a first capacitor having a first terminal coupled to the first current electrode of the first transistor and a second terminal coupled to the first current electrode of the second transistor;
    a second capacitor having a first terminal coupled to the second current electrode of the third transistor and a second terminal coupled to the second current electrode of the fourth transistor;
    a first inductor having a first terminal coupled to the first terminal of the first capacitor and a second terminal coupled to the first terminal of the second capacitor; and
    a second inductor having a first terminal coupled to the second terminal of the first capacitor and a second terminal coupled to the second terminal of the second capacitor.

4. The integrated circuit of claim 3, wherein each of the first capacitor and the second capacitor is characterized as a variable capacitor.

5. The integrated circuit of claim 3, wherein the first and second inductors are configured as a second transformer.

6. An integrated circuit comprising:
    a first high-pass filter having an input coupled to receive a first signal and an output coupled to a first input of a first differential pair of transistors;
    a second high-pass filter having an input coupled to receive a second signal and an output coupled to a second input of the first differential pair of transistors, the second signal a complementary signal of the first signal;
    a second differential pair of transistors having control electrodes coupled to a first voltage supply terminal;
    a boost circuit coupled between the second differential pair of transistors and the first voltage supply terminal;
    a load resistor pair coupled between the boost circuit and the first voltage supply terminal;
    an output resistor coupled between first current electrodes of the second differential pair of transistors; and
    a low-pass filter coupled between the first differential pair of transistors and the second differential pair of transistors.

7. The integrated circuit of claim 6, wherein the first differential pair of transistors is configured in a common-source arrangement.

8. The integrated circuit of claim 6, wherein the first high-pass filter comprises a first capacitor having a first terminal coupled to the first input of the first differential pair and to a first terminal of a first resistor, a second terminal of the first resistor coupled to a second voltage supply terminal, and wherein the second high-pass filter comprises a second capacitor having a first terminal coupled to the second input of the first differential pair and to a first terminal of a second resistor, a second terminal of the second resistor coupled to the second voltage supply terminal.

9. The integrated circuit of claim 8, wherein the second voltage supply terminal is coupled to provide a positive bias voltage.

10. The integrated circuit of claim 6, wherein the low-pass filter comprises:
    a first capacitor having a first terminal and a second terminal coupled to current electrodes of the first differential pair of transistors;
    a second capacitor having a first terminal and a second terminal coupled to current electrodes of the second differential pair of transistors;
    a first inductor having a first terminal coupled to the first terminal of the first capacitor and a second terminal coupled to the first terminal of the second capacitor; and
    a second inductor having a first terminal coupled to the second terminal of the first capacitor and a second terminal coupled to the second terminal of the second capacitor.

11. The integrated circuit of claim 10, wherein each of the first capacitor and the second capacitor is characterized as a variable capacitor.

12. An integrated circuit comprising:
a first amplifier circuit comprising:
   a first high-pass filter having an input coupled to receive a first signal and an output coupled to a first input of a first differential pair of transistors;
   a second high-pass filter having an input coupled to receive a second signal and an output coupled to a second input of the first differential pair of transistors, the second signal a complementary signal of the first signal;
   a second differential pair of transistors having control electrodes coupled to a first voltage supply terminal;
   a boost circuit coupled between the second differential pair of transistors and the first voltage supply terminal; and
   a low-pass filter coupled between the first differential pair of transistors and the second differential pair of transistors;
a low noise amplifier (LNA) circuit coupled to receive a radio frequency signal; and
a first mixer circuit having a first differential input coupled to a differential output of the LNA circuit, and a first differential output coupled to inputs of the first and second high-pass filters of the first amplifier circuit.

13. The integrated circuit of claim 12, wherein the first high-pass filter of the first amplifier circuit comprises a first capacitor having a first terminal coupled to the first input of the first differential pair and to a first terminal of a first resistor, a second terminal of the first resistor coupled to a second voltage supply terminal, and wherein the second high-pass filter of the second amplifier circuit comprises a second capacitor having a first terminal coupled to the second input of the first differential pair and to a first terminal of a second resistor, a second terminal of the second resistor coupled to the second voltage supply terminal.

14. The integrated circuit of claim 12, wherein the low-pass filter of the first amplifier circuit comprises:
   a first capacitor having a first terminal and a second terminal coupled to current electrodes of the first differential pair of transistors;
   a second capacitor having a first terminal and a second terminal coupled to current electrodes of the second differential pair of transistors;
   a first inductor having a first terminal coupled to the first terminal of the first capacitor and a second terminal coupled to the first terminal of the second capacitor; and
   a second inductor having a first terminal coupled to the second terminal of the first capacitor and a second terminal coupled to the second terminal of the second capacitor.

15. An integrated circuit comprising:
a first input terminal coupled to receive a first signal;
a second input terminal coupled to receive a second signal, the second signal a complementary signal of the first signal;
a first high-pass filter coupled between the first input terminal and a control electrode of a first transistor;
a second high-pass filter coupled between the second input terminal and a control electrode of a second transistor;
a third transistor having a control electrode coupled to a first voltage supply terminal and a first current electrode coupled to a first output terminal;
a fourth transistor having a control electrode coupled to the first voltage supply terminal and a first current electrode coupled to a second output terminal;
an output resistor coupled between the first output terminal and the second output terminal; and
a low-pass filter coupled between first current electrodes of the first and second transistors and second current electrodes of the third and fourth transistors, the low-pass filter comprising:
   a first capacitor having a first terminal coupled to the first current electrode of the first transistor and a second terminal coupled to the first current electrode of the second transistor;
   a second capacitor having a first terminal coupled to the second current electrode of the third transistor and a second terminal coupled to the second current electrode of the fourth transistor;
   a first inductor having a first terminal coupled to the first terminal of the first capacitor and a second terminal coupled to the first terminal of the second capacitor; and
   a second inductor having a first terminal coupled to the second terminal of the first capacitor and a second terminal coupled to the second terminal of the second capacitor, the first and second inductors configured as a transformer.

16. The integrated circuit of claim 15, wherein the first high-pass filter comprises a first capacitor having a first terminal coupled to the first input and to a first terminal of a first resistor, a second terminal of the first resistor coupled to a second voltage supply terminal, and wherein the second high-pass filter comprises a second capacitor having a first terminal coupled to the second input and to a first terminal of a second resistor, a second terminal of the second resistor coupled to the second voltage supply terminal.

17. The integrated circuit of claim 16, wherein the second voltage supply terminal is coupled to provide a positive bias voltage.

18. The integrated circuit of claim 15, further comprising a boost circuit coupled between first voltage supply terminal and first and second output terminals.

19. The integrated circuit of claim 18, further comprising a load resistor pair coupled between the boost circuit and the first voltage supply terminal.

20. The integrated circuit of claim 15, wherein each of the first capacitor and the second capacitor is characterized as a variable capacitor.

* * * * *